United States Patent
Zhou et al.

(10) Patent No.: US 8,347,951 B2
(45) Date of Patent: *Jan. 8, 2013

(54) HEAT DISSIPATION DEVICE

(75) Inventors: Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 950 days.

This patent is subject to a terminal disclaimer.

(21) Appl. No.: 12/239,830

(22) Filed: Sep. 29, 2008

(65) Prior Publication Data

US 2009/0266521 A1    Oct. 29, 2009

(30) Foreign Application Priority Data

Apr. 28, 2008   (CN) .......................... 2008 1 0066843

(51) Int. Cl.
*F28F 7/00* (2006.01)
*H05K 7/20* (2006.01)

(52) U.S. Cl. ....... 165/80.2; 165/80.4; 361/694; 361/697

(58) Field of Classification Search .................... 165/85, 165/8.3, 104.33, 185, 80.4; 361/699, 700, 361/694, 697
See application file for complete search history.

(56) References Cited

U.S. PATENT DOCUMENTS

| | | | | |
|---|---|---|---|---|
| 3,403,252 A * | 9/1968 | Nagy | ............................ | 361/231 |
| 3,876,410 A * | 4/1975 | Scholes | ........................ | 65/60.52 |
| 3,953,753 A * | 4/1976 | Barrett | .......................... | 310/168 |
| 3,957,418 A * | 5/1976 | Sata | ................................... | 431/9 |
| 5,796,581 A * | 8/1998 | Mok | .......................... | 361/679.27 |
| 6,039,111 A * | 3/2000 | Kawaguchi et al. | ..... | 165/104.14 |
| 6,055,157 A * | 4/2000 | Bartilson | ....................... | 361/699 |
| 6,141,217 A * | 10/2000 | Nakahama et al. | ........... | 361/694 |
| 6,176,101 B1 * | 1/2001 | Lowenstein | .................... | 62/484 |
| 6,336,497 B1 * | 1/2002 | Lin | .............................. | 165/80.3 |
| 6,367,542 B1 * | 4/2002 | Chen | ............................. | 165/80.3 |
| 6,449,152 B1 * | 9/2002 | Lin | ................................ | 361/697 |
| 6,620,366 B2 * | 9/2003 | Sagal | ........................ | 264/272.11 |
| 6,638,033 B2 * | 10/2003 | Wang | ............................. | 417/356 |
| 6,640,882 B2 * | 11/2003 | Dowdy et al. | ................ | 165/80.3 |
| 6,668,911 B2 * | 12/2003 | Bingler | ......................... | 165/80.4 |
| 6,702,002 B2 * | 3/2004 | Wang | ............................ | 165/80.3 |
| 6,736,192 B2 * | 5/2004 | Chang | ........................... | 165/80.3 |
| 6,817,406 B1 * | 11/2004 | Inoue et al. | .................... | 165/115 |
| 6,826,049 B2 * | 11/2004 | Chen | ............................. | 361/697 |
| 6,834,713 B2 * | 12/2004 | Ghosh et al. | ............. | 165/104.33 |
| 6,894,899 B2 * | 5/2005 | Wu et al. | ........................ | 361/699 |
| 6,935,410 B2 * | 8/2005 | Lee et al. | ...................... | 165/80.3 |
| 6,945,314 B2 * | 9/2005 | Farrow et al. | ................ | 165/80.3 |
| 6,963,149 B2 * | 11/2005 | Chang et al. | ................ | 310/67 R |

(Continued)

*Primary Examiner* — Khoa Huynh
*Assistant Examiner* — Timothy K Trieu
(74) *Attorney, Agent, or Firm* — Altis Law Group, Inc.

(57) ABSTRACT

A heat dissipation device includes a canister filled with a phase-changeable working fluid, a housing hermetically fixed to a top of the canister and communicating with the canister, a fan located above a top of the housing and an impeller comprising a driving member received in the housing, an annular magnet accommodated in the hub and an axle coaxially connecting the driving member and the annular magnet together. The fan includes a plurality of windings fixed on an inner side thereof. When the working fluid is heated and vaporized to move through the driving member, the driving member is driven by the vaporized working fluid to rotate, whereby the annular magnet rotates within the windings to cause the windings to generate a current.

14 Claims, 4 Drawing Sheets

U.S. PATENT DOCUMENTS

| | | |
|---|---|---|
| 6,988,536 B2 * 1/2006 | Lee et al. | 165/104.33 |
| 7,016,195 B2 * 3/2006 | Ito et al. | 361/699 |
| 7,051,794 B2 * 5/2006 | Luo | 165/104.26 |
| 7,055,581 B1 * 6/2006 | Roy | 165/104.33 |
| 7,162,887 B2 * 1/2007 | Symons | 62/259.2 |
| 7,163,740 B2 * 1/2007 | Rosati et al. | 428/343 |
| 7,165,413 B2 * 1/2007 | Symons | 62/259.2 |
| 7,224,585 B2 * 5/2007 | Lee et al. | 361/699 |
| 7,475,718 B2 * 1/2009 | Reyzin et al. | 165/104.33 |
| 7,571,618 B2 * 8/2009 | Dessiatoun | 62/259.2 |
| 7,793,027 B2 * 9/2010 | Mok et al. | 710/304 |
| 7,980,078 B2 * 7/2011 | McCutchen et al. | 60/645 |
| 2001/0050164 A1 * 12/2001 | Wagner et al. | 165/104.33 |
| 2002/0046826 A1 * 4/2002 | Kao | 165/104.33 |
| 2002/0167799 A1 * 11/2002 | Kawashima et al. | 361/700 |
| 2003/0160833 A1 * 8/2003 | Kayanuma et al. | 346/103 |
| 2003/0207241 A1 * 11/2003 | Manual et al. | 434/252 |
| 2004/0011511 A1 * 1/2004 | Ghosh et al. | 165/104.21 |
| 2004/0070941 A1 * 4/2004 | Ghosh et al. | 361/700 |
| 2004/0182099 A1 * 9/2004 | Hsu | 62/259.2 |
| 2004/0196632 A1 * 10/2004 | Chen et al. | 361/697 |
| 2005/0061486 A1 * 3/2005 | Yang | 165/104.33 |
| 2005/0147511 A1 * 7/2005 | Hsu et al. | 417/423.12 |
| 2005/0180103 A1 * 8/2005 | Ku | 361/695 |
| 2006/0023425 A1 * 2/2006 | Iijima et al. | 361/699 |
| 2007/0119583 A1 * 5/2007 | Foster et al. | 165/185 |
| 2007/0246195 A1 * 10/2007 | Bhatti et al. | 165/104.33 |
| 2007/0246196 A1 * 10/2007 | Bhatti et al. | 165/104.33 |
| 2007/0272390 A1 * 11/2007 | Hu | 165/80.1 |
| 2008/0060370 A1 * 3/2008 | Keene et al. | 62/236 |
| 2008/0075611 A1 * 3/2008 | Lai et al. | 417/420 |
| 2008/0083528 A1 * 4/2008 | Chen et al. | 165/121 |
| 2008/0186679 A1 * 8/2008 | Matsushima et al. | 361/700 |

* cited by examiner

HEAT DISSIPATION DEVICE

BACKGROUND OF THE INVENTION

1. Field of the Invention

The present invention relates generally to a heat dissipation device, and more particularly to a heat dissipation device utilizing a self-circulated fluid system.

2. Description of Related Art

Heat sinks usually remove heat from electronic heat-generating components, such as central processing units (CPUs) etc., to keep the components in stable operation. A typical heat sink comprises a base contacting the heat-generating component to absorb heat therefrom and a plurality of parallel planar fins soldered or adhered to the base. The fins dissipate the heat into ambient atmosphere. To enhance efficiency, a fan is usually mounted on a top or a side of the heat sink to impel air between the fins.

Conventionally, heat generated by the electronic heat-generating components is dissipated directly into the environment via the heat sink, raising the temperature of the surrounding environment rendering the overall system potentially susceptible to damage, thereby shortening the lifespan thereof. Furthermore, heat transfer from the electronic heat-generating components to the surrounding atmosphere without any reasonable recycling component constitutes energy waste.

What is needed is a heat dissipation device capable of recycling heat energy radiated by a heat-generating component, thereby overcoming the described limitations.

SUMMARY OF THE INVENTION

The present invention relates to a heat dissipation device for dissipating heat from a heat-generating electronic element, includes a canister filled with a phase-changeable working fluid and receiving heat from the heat-generating electronic component, a housing, a fan, an impeller. The housing is hermetically fixed to a top of the canister and communicates with the canister. The fan located above a top of the housing, includes a plurality of windings fixed to an inside of the fan. The impeller consists of a driving member received in the housing, an annular magnet accommodated in the inside of the fan and surrounded by the windings and an axle coaxially connecting the driving member and the annular magnet together. The fan includes a hub having an opening facing the housing and a plurality of blades extending outwardly from a circumference of the hub. The axle has a lower end extending downwardly through a bottom of the housing to a center of the top of the canister and an upper end extending upwardly through a top of the housing. When the working fluid is heated by the heat-generating electronic element and vaporized to move into the housing and through the driving member, the driving member is driven by the working fluid to rotate. The annular magnet is rotated accordingly within the windings, whereby the windings are induced by the annular magnet to generate a current therein.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
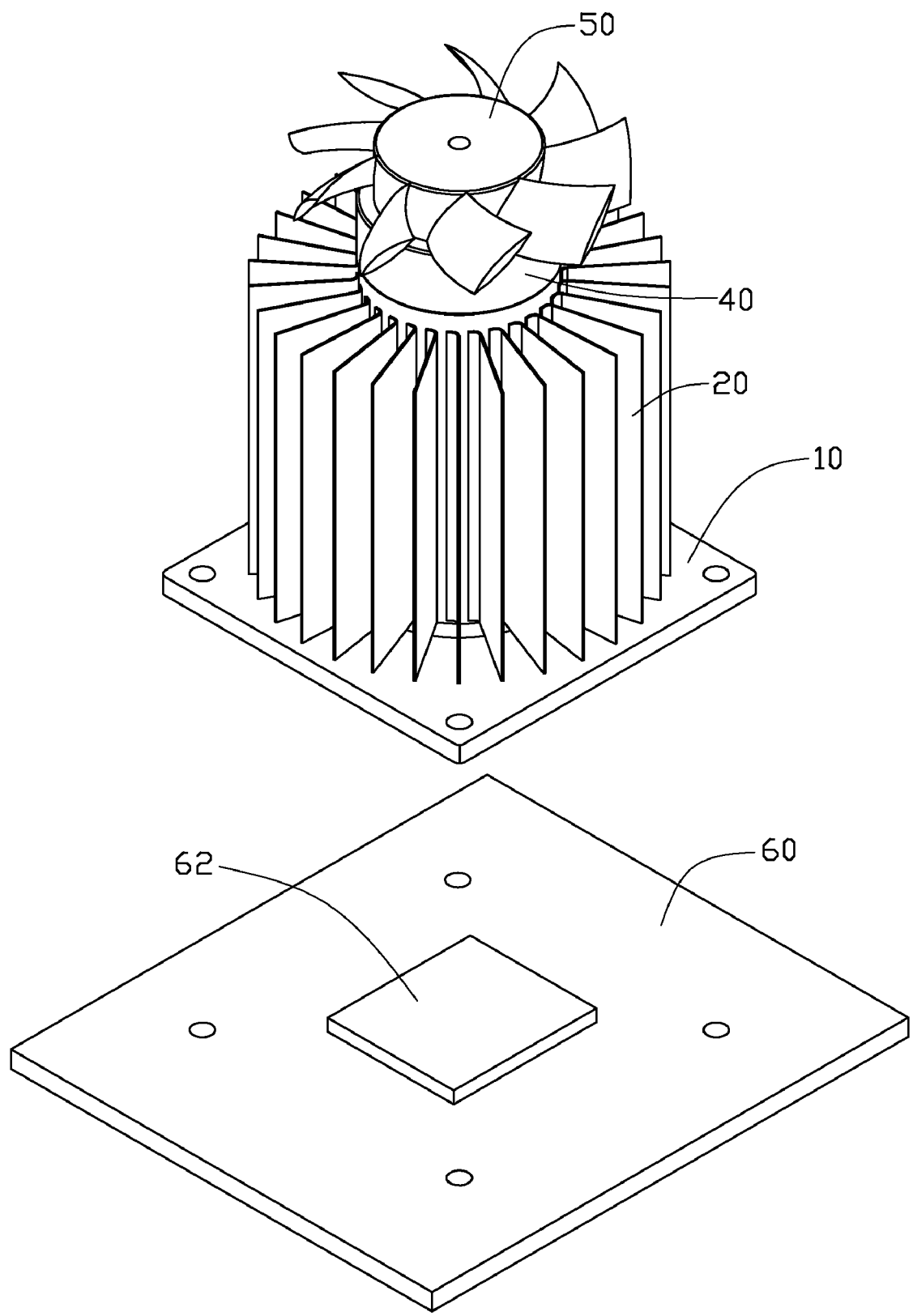
FIG. 1 is an assembled view of a heat dissipation device in accordance with a preferred embodiment of the present invention.
Figure 2:
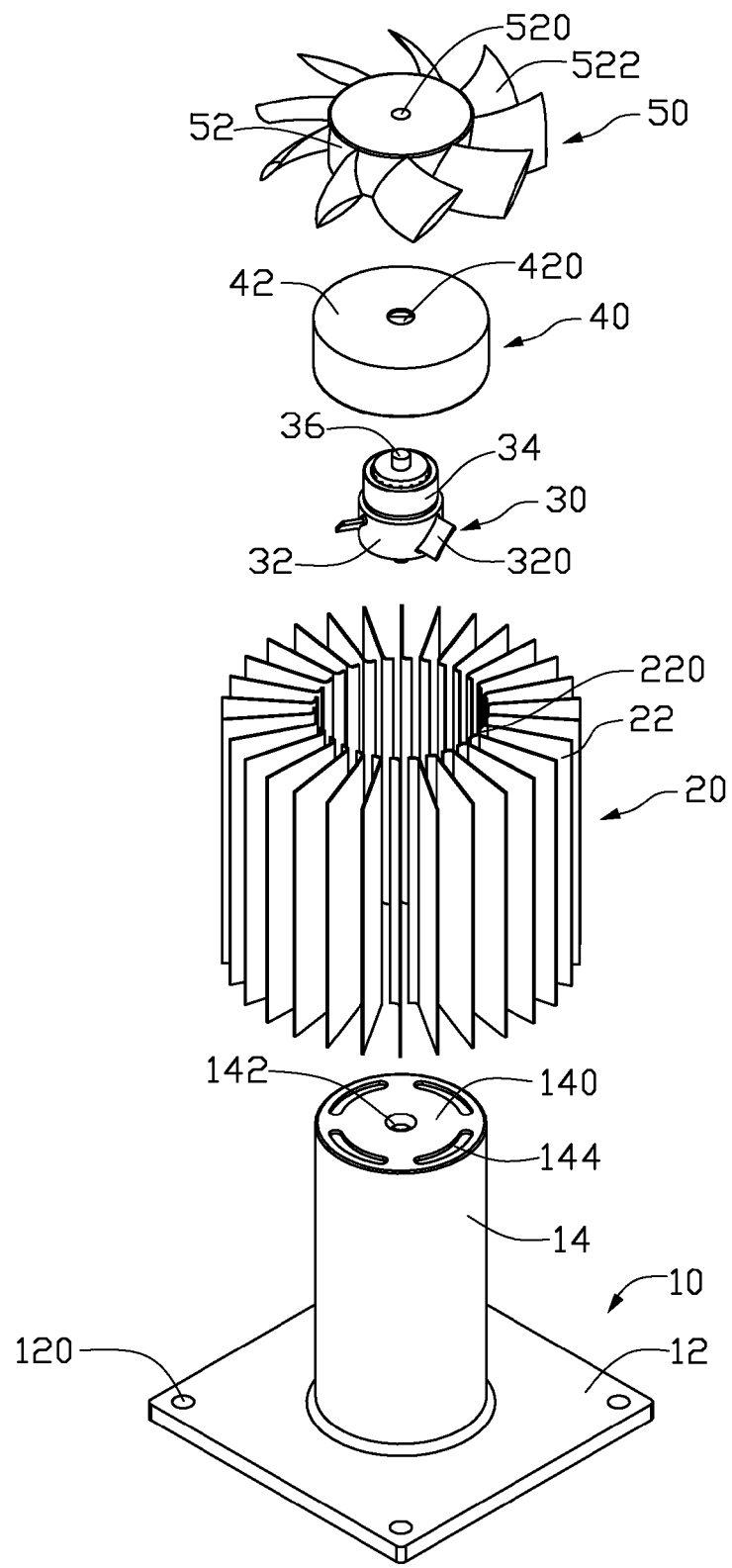
FIG. 2 is an exploded, isometric view of FIG. 1.
Figure 3:
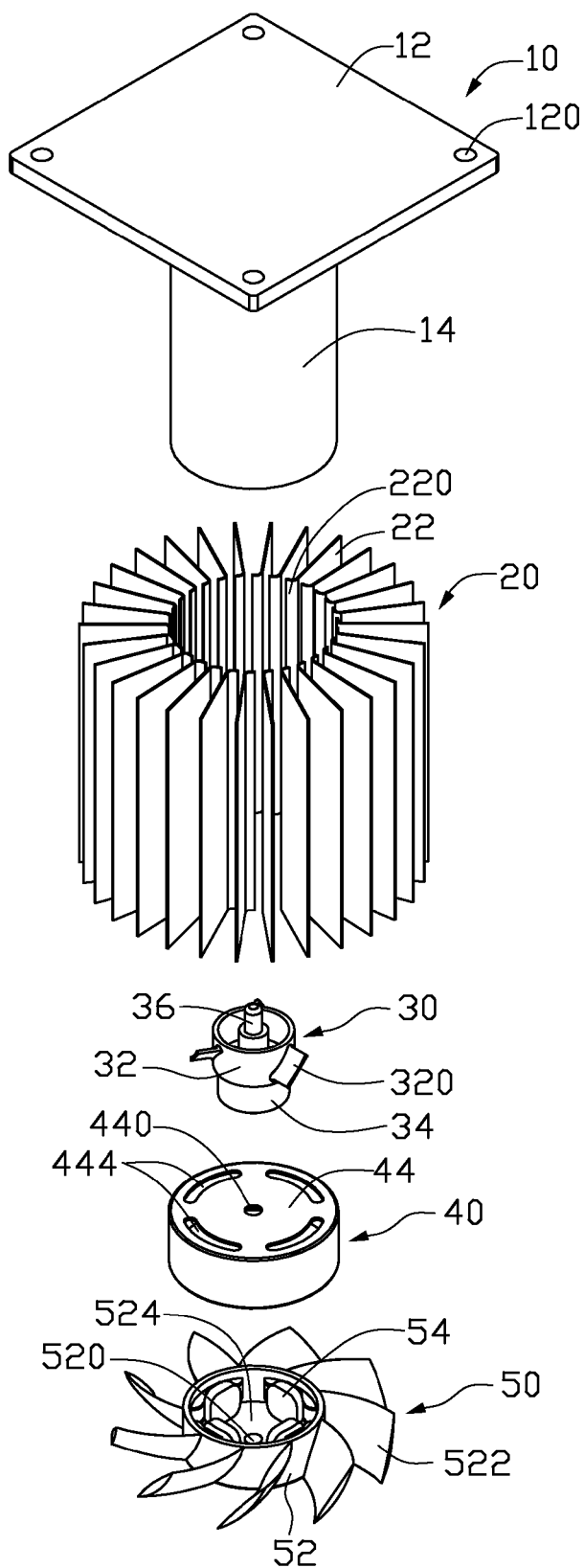
FIG. 3 is an inverted view of FIG. 2.

Referring to FIGS. 1 to 3, a heat dissipation device in accordance with a preferred embodiment of the invention removes heat from a heat-generating component 62 mounted on a printed circuit board 60. The heat dissipation device comprises a heat conductive member 10, a fin unit 20 attached to the conductive member 10, an impeller 30 mounted on a top of the conductive member 10, a housing 40 fixed to the top of the conductive member 10 and receiving a lower portion of the impeller 30 therein and a fan 50 located on a top of the housing 40 and interacting with an upper portion of the impeller 30.

The conductive member 10 comprises a base plate 12 and a canister 14 vertically mounted on a top of the base plate 12. The base plate 12 is a rectangular flat plate, with a bottom surface contacting the heat generating component 62 and defining four mounting holes 120 in four corners thereof to install the heat dissipation device onto the heat-generating component 62. The canister 14 acts as a vapor chamber and includes a metal casing of highly thermally conductive material, such as copper or copper alloy, a phase-changeable working fluid contained in the casing and a capillary wick arranged on an inner surface of the casing. The canister 14 at a top thereof has a top plate 140 which defines a circular bay 142 in a center of a top surface thereof. The top plate 140 defines a plurality of curved vents 144 therein, extending along and near a rim of the top plate 140 and being symmetrical with each other relative to the bay 142.

The fin unit 20 comprises a plurality of fins 22 attached to a periphery of the canister 14 and extending radially and outwardly from the periphery of the canister 14. The fins 22 are rectangular flakes, symmetrical with each other relative to an axis of the canister 14 and have flanges 220 bent perpendicularly from inner side edges thereof. The flanges 220 are securely fixed to the periphery of the canister 14 by soldering.

The impeller 30 comprises a driving member 32, an annular magnet 34 above the driving member 32, and an axle 36 coaxially extending through a center of the driving member 32 and the annular magnet 34. The driving member 32, separated from and located under the annular magnet 34, is received in the housing 40 and has a plurality of blades 320 formed at a circumference thereof. The annular magnet 34 secured to the axle 36 is located above a top of the housing 40. The axle 36 has a lower end projecting downwardly from a bottom of the driving member 32 for being inserted into the bay 142 in the top plate 140 of the canister 14, and an upper end projecting upwardly beyond a top of the annular magnet 34 for engaging with the fan 50.

Figure 4:
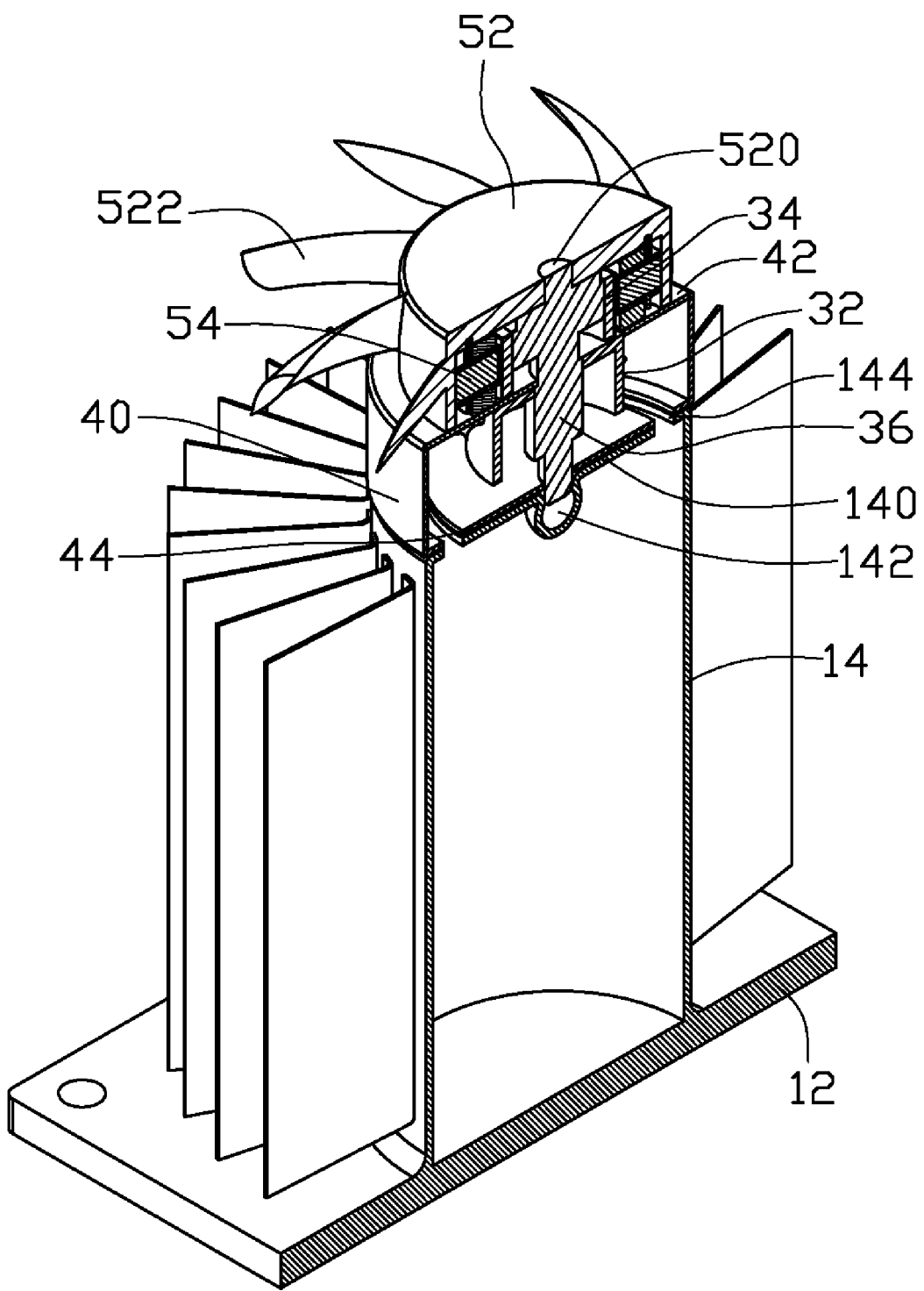
FIG. 4 is a cross section of the heat dissipation device in FIG. 1.

Referring to FIG. 2 and FIG. 4, the housing 40 is cylindrical and has a caliber identical to that of the canister 14. The housing 40 has a top panel 42 and a bottom panel 44 parallel and opposite thereto. The top panel 42 is located between the driving member 32 and the annular magnet 34 of the impeller 30 and defines a through hole 420 in a center thereof, providing a passage for upward extension of the upper end of the axle 36 of the impeller 30. The bottom panel 44 is attached to a top surface of the top plate 140 of the canister 14 and defines a through hole 440 (shown in FIG. 3) in the center thereof for downward extension of the lower end of the axle 36 therethrough into the bay 142 of the top plate 140. The bottom panel 44 therein defines a plurality of vents 444 identical to and respectively communicating with the vents 144 of the top plate 140 of the canister 14.

Referring to FIGS. 2-3, the fan 50 comprises a hub 52, a plurality of blades 522 extending outwardly from a circumference thereof and a plurality of windings 54 for having an electromagnetic interaction with the annular magnet 34. The windings 54 are formed by winding copper wires. The hub 52 has a caliber slightly smaller than that of the housing 40 and an opening 524 facing the housing 40 and receiving the annular magnet 34 therein. The hub 52 defines a positioning hole 520 in a center of a top surface thereof for receiving the upper end of the axle 36 of the impeller 30 therein. The windings 54 are mounted to an inner sidewall of the hub 32, symmetrical with each other and closely surround the annular magnet 34 of the impeller 30.

Particularly referring to FIG. 4, in assembly of the heat dissipation device, a bottom surface of the bottom panel 44 of the housing 40 is hermetically attached to a top surface of the top plate 140 of the canister 14 with the vents 144, 444 communicating with each other. The through hole 440 is aligned with the bay 142. The driving member 32 of the impeller 30 is sealed in the housing 40, while the annular magnet 34 of the impeller 30 located over the housing 40 is accommodated in the hub 52 of the fan 50 and closely surrounded by the windings 54 of the hub 52. The lower end of the axle 36 is positioned in the bay 142 of the top plate 140 of the canister 14 and the upper end of the axle 36 is positioned in the positioning hole 520 of the fan 50.

In use of the heat dissipation device, the working fluid in the canister 14 is heated by the heat-generating component 62 contacting a bottom surface of the base plate 12 below the canister 14 and vaporized. As a result of increased air pressure in the canister 14 as the working fluid vaporizes, the working fluid in vapor form moves toward and through the vents 144, 444 of the top plate 140 of the canister 14 and the bottom panel 44 of the housing 40 and then reaches the blades 320 of the driving member 32. The vaporized flow of the working fluid flows through and rotates the blades 320 of the driving member 32, and the annular magnet 34 securely mounted on the axle 36 of the impeller 30 is correspondingly rotated synchronously with the driving member 32. Thus, the annular magnet 34 rotates within the windings 54. According to Faraday's law of induction, the rotating annular magnet 34 induces the windings 54 to produce an electronic current therein. In addition, the working fluid in vapor form condenses to liquid form when hitting on the blades 320 of the driving member 32, and is then wicked back to a lower portion of the canister 14 via capillary action in the canister 14 to resume the circulation.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for dissipating heat from a heat-generating electronic element, the device comprising:

a canister filled with a phase-changeable working fluid and adapted for receiving heat from the heat-generating electronic component;

a housing hermetically fixed to a top of the canister and communicating with the canister;

a fan located on a top of the housing, the fan comprising a hub having an opening facing the housing, a plurality of blades extending outwardly from a circumference of the hub and a plurality of windings fixed on an inner side of the hub; and an impeller comprising a driving member received in the housing, an annular magnet accommodated in the hub of the fan and surrounded by the windings and an axle coaxially connecting the driving member and the annular magnet together, wherein when the driving member rotates the annular magnet rotates accordingly;

wherein the axle comprises a lower end extending downwardly through a bottom of the housing to a center of the top of the canister and an upper end extending upwardly through a top of the housing to be received in the fan and wherein when the working fluid is heated by the heat-generating electronic element and vaporized to move into the housing and through the driving member, the driving member is driven by the vaporized working fluid to rotate, whereby the annular magnet is rotated within the windings and the windings are induced by the rotating annular magnet to generate a current therein.

2. The heat dissipation device of claim 1, wherein the annular magnet is located on the housing and spaced from the windings which are symmetrical with each other relative to the axle.

3. The heat dissipation device of claim 1, wherein the upper end of the axle of the impeller is received in a center hole defined in a top of the hub of the fan.

4. The heat dissipation device of claim 1, wherein the canister comprises a top plate defining a bay in a center thereof, the bay receiving the lower end of the axle.

5. The heat dissipation device of claim 1, wherein the housing comprises a top panel between the fan and the driving member, the top panel defining in a center thereof a through hole receiving the axle, and a bottom panel defining in a center thereof a through hole for extension of the lower end of the axle therethrough.

6. The heat dissipation device of claim 5, wherein the bottom panel is hermetically attached to the top of canister and therein defines a plurality of vents respectively communicating with a plurality of corresponding vents defined in the top of the canister.

7. The heat dissipation device of claim 1, further comprising a plurality of fins extending radially and outwardly from a periphery of the canister, the fins including flanges each bent perpendicularly from an inner side edge of each of the fins and attached to the periphery of the canister.

8. The heat dissipation device of claim 1, wherein the canister is vertically mounted on a center of a base plate defining a plurality of mounting holes in corners thereof.

9. A heat dissipation device adapted for dissipating heat from a heat-generating electronic element, comprising:

a canister filled with a phase-changeable working fluid;

a housing hermetically fixed to a top of the canister and communicating with the canister;

a fan located on a top of the housing, the fan comprising a hub having an opening facing the housing and a plurality of blades extending outwardly from a circumference of the hub and a plurality of windings fixed on an inner side of the hub; and an impeller comprising a driving member received in the housing, an annular magnet accommodated in the hub of the fan and surrounded by the windings and an axle extending through a center of the driving member and a center of the annular magnet;

wherein the axle comprises a lower end extending downwardly through a bottom of the housing to a center of the top of the canister and an upper end extending upwardly through a top of the housing to be received in a top of the hub and wherein when the working fluid is heated by the heat-generating electronic element and vaporized into the housing, the vaporized working fluid drives the driving member to rotate, whereby the annular magnet rotates accordingly within the windings of the fan to cause the windings to generate a current therein.

10. The heat dissipation device of claim 9, wherein a center of the top of the hub of the fan therein defines a positioning hole engagingly receiving the upper end of the axle.

11. The heat dissipation device of claim 9, wherein the canister has a top plate, the top plate defining a bay receiving the lower end of the axle therein.

12. The heat dissipation device of claim 11, wherein the housing comprises a top panel between the annular magnet and the driving member, the top panel defining a through hole receiving the axle, and a bottom panel defining a through hole for the lower end of the axle to extend therethrough into the canister.

13. The heat dissipation device of claim 12, wherein the bottom panel is hermetically attached to the top of canister and therein defines a plurality of vents respectively communicating with a plurality of corresponding vents defined in the top of the canister.

14. The heat dissipation device of claim 9 further comprising a plurality of fins extending radially and outwardly from a periphery of the canister, each fin having a bent flange attached to the periphery of the canister.

* * * * *